(12) United States Patent
Lee

(10) Patent No.: US 7,982,311 B2
(45) Date of Patent: Jul. 19, 2011

(54) SOLDER LIMITING LAYER FOR INTEGRATED CIRCUIT DIE COPPER BUMPS

(75) Inventor: Kevin J. Lee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 383 days.

(21) Appl. No.: 12/317,227

(22) Filed: Dec. 19, 2008

(65) Prior Publication Data

US 2010/0155946 A1    Jun. 24, 2010

(51) Int. Cl.
*H01L 23/488* (2006.01)

(52) U.S. Cl. ........ 257/737; 257/778; 257/779; 257/781; 257/E23.021; 257/E23.023; 438/613

(58) Field of Classification Search .................. 257/737, 257/738, 778, 779, 780, 781, E23.021, E23.023; 438/613
See application file for complete search history.

(56) References Cited

U.S. PATENT DOCUMENTS

| | | | |
|---|---|---|---|
| 3,429,040 A * | 2/1969 | Miller | 29/840 |
| 5,034,345 A | 7/1991 | Shirahata | |
| 5,220,200 A * | 6/1993 | Blanton | 257/778 |
| 5,282,565 A * | 2/1994 | Melton | 228/180.22 |
| 5,880,017 A * | 3/1999 | Schwiebert et al. | 438/613 |
| 6,409,073 B1 * | 6/2002 | Kaskoun et al. | 228/180.22 |
| 6,444,561 B1 * | 9/2002 | Wang et al. | 438/612 |
| 6,583,515 B1 * | 6/2003 | James et al. | 257/779 |
| 7,059,512 B2 * | 6/2006 | Arita et al. | 228/254 |
| 7,135,770 B2 * | 11/2006 | Nishiyama et al. | 257/734 |
| 7,268,438 B2 * | 9/2007 | Nishiyama et al. | 257/780 |
| 7,287,323 B1 * | 10/2007 | Ehlert et al. | 29/843 |
| 7,449,406 B2 * | 11/2008 | Nishiyama et al. | 438/612 |
| 7,749,888 B2 * | 7/2010 | Nishiyama et al. | 438/612 |
| 2002/0132461 A1 | 9/2002 | Kizaki | |
| 2007/0184578 A1 | 8/2007 | Lin et al. | |
| 2008/0020602 A1 * | 1/2008 | Shih | 439/67 |
| 2008/0054461 A1 | 3/2008 | Lang et al. | |
| 2010/0065966 A1 * | 3/2010 | Pendse et al. | 257/737 |
| 2010/0155946 A1 * | 6/2010 | Lee | 257/738 |

FOREIGN PATENT DOCUMENTS

WO    2010/080275 A2    7/2010

OTHER PUBLICATIONS

International Search Report and Written Opinion for PCT Patent Application No. PCT/US2009/066933, mailed on Jul. 2, 2010, 8 pages.

* cited by examiner

*Primary Examiner* — Mary Wilczewski
(74) *Attorney, Agent, or Firm* — Rahul D. Engineer

(57) ABSTRACT

An apparatus comprises a semiconductor substrate having a device layer, a plurality of metallization layers, a passivation layer, and a metal bump formed on the passivation layer that is electrically coupled to at least one of the metallization layers. The apparatus further includes a solder limiting layer formed on the passivation layer that masks an outer edge of the top surface of the metal bump, thereby making the outer edge of the top surface non-wettable to a solder material.

22 Claims, 9 Drawing Sheets

SOLDER LIMITING LAYER FOR INTEGRATED CIRCUIT DIE COPPER BUMPS

BACKGROUND

In the manufacture of integrated circuits, a flip-chip connection is often used to attach an integrated circuit die (IC die) to a carrier substrate, such as an integrated circuit package (IC package) or a motherboard. A flip-chip configuration uses an array of metal bumps that are arranged on the surface of the IC die. The metal bumps are aligned with corresponding solder balls on the IC package. Once aligned, an annealing process is carried out at a temperature above the melting point of the solder to cause the solder balls to reflow and wet the surface of the metal bumps. The solder balls and metal bumps are then rapidly cooled to minimize the intermixing of metals. Spaces between and around the metal bump/solder ball connections are filled with an underfill material, such as an epoxy resin.

A critical issue that is challenging the whole microelectronics industry is the cracking and delamination of relatively weak low-k interlayer dielectric (ILD) layers within the IC die which occur during the flip-chip packaging process. With current designs, the load upon the ILD layers within the IC die is high due to shear stresses from thermal expansion mismatches and normal stresses due to die and package warping behavior. Historically, ILD cracking and delamination has not been an issue in the industry because silicon dioxide, a relatively strong dielectric material, has been typically used for the ILD layers. But because the use of relatively weak low-k dielectric materials is becoming standard in the industry, improved designs are needed to reduce the cracking and delamination of ILD layers containing these low-k materials. Furthermore, as the dimensions of integrated circuit dies and packages continue to scale down, these problems are expected to become increasingly troublesome because of the trend towards reduced bump pitches and reduced bump diameters.

DETAILED DESCRIPTION

Described herein are systems and methods of reducing mechanical stress at the metal bump layer of an integrated circuit package. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
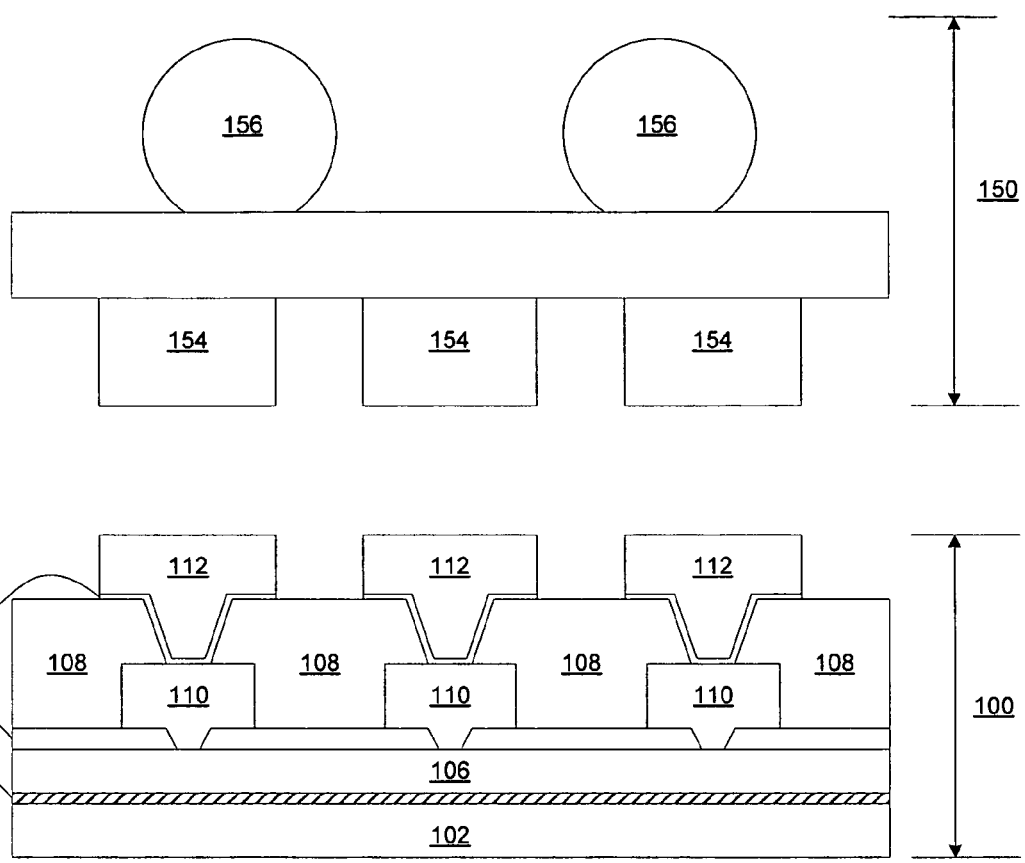
FIG. 1A illustrates a conventional metal bump/solder ball connection.

FIG. 1A illustrates a conventional IC die 100 and IC package 150 prior to being coupled. The IC die 100 is shown having a substrate 102, a device layer 104, metallization layers 106, multiple passivation layers 108, a final thick metallization layer 110, and a plurality of metal bumps 112. The bumps 112 may be formed using metals including, but not limited to, copper, nickel, palladium, gold, and alternate metals or alloys, such as an alloy of lead and tin. The structure may also include barrier and seed layers 114 between the metal bumps 112 and the final passivation layer 108, which are also referred to as bump limiting metal (BLM) layers 114. The IC die 100 of FIG. 1A is provided as a representative example of an IC die and many other variations are known in the art. Implementations of the invention provided herein are not intended to, and should not, be limited to the specific IC die structure described in FIG. 1A.

As is well known in the art, the substrate 102 may be formed using materials such as bulk silicon, silicon-on-insulator materials, germanium containing materials, and other materials suitable for use as a semiconductor substrate. The device layer 104 is the top surface of the substrate 102 and contains various electronic devices, including but not limited to transistors, capacitors, interconnects, and shallow trench isolation structures (none of which are shown).

The metallization layers 106 serve to interconnect the various devices on the semiconductor substrate 102. The metallization layers 106 may include metal interconnects, inter-level dielectric (ILD) layers used to separate and insulate the metal interconnects, and vias that penetrate through the ILD layers to couple the metal interconnects together. The ILD layers may be formed of materials such as carbon doped oxide and silicon dioxide. It is these ILD layers that often become cracked or delaminated by the stresses induced by the flip-chip packaging process. The metal interconnects and vias are generally formed of metals or alloys containing copper or tungsten.

One or more passivation layers 108 are generally formed atop the metallization layers 106. The passivation layers 108 seal and protect the IC die from damage and contamination. The passivation layers 108 may be formed from many different materials, including but not limited to ILDs, nitrides, silicon dioxide, polybenzoxazoles, epoxies, silicones, bis-benzocyclobutene, phenolic resins, and polyimides. A final thick metallization layer 110 may be used to provide a robust connection between the metallization layers 106 and a plurality of metal bumps 112 formed atop the passivation layers 108.

The metal bumps 112 maintain electrical connections to the metallization layers of the integrated circuit die by way of metal vias formed through the passivation layers 108. The BLM layers 114 are typical barrier and seed layers for the metal bumps 112. As mentioned above, the metal bumps 112 are generally formed using copper, nickel, palladium, gold, or an alloy of lead and tin in alternate implementations. The metal bumps 112 may be formed using well known processes in the art that include, but are not limited to, CVD, PVD, ALD, PECVD, electroplating, and electroless plating.

FIG. 1A further illustrates the IC package 150 including a substrate 152 having a plurality of solder balls 154 mounted on one side of the substrate 152. The solder balls 154 may be formed of any conventional solder material, for instance, an alloy of tin, silver, and copper may be used. The substrate 152 acts as a mini-printed circuit board routing the solder balls 154 to a number of electrical connections mounted on another side of the substrate 152. These electrical connections are arranged in the form of a grid array 156, such as a pin grid array (PGA), a ball grid array (BGA), or a land grid array (LGA).

Figure 1B:
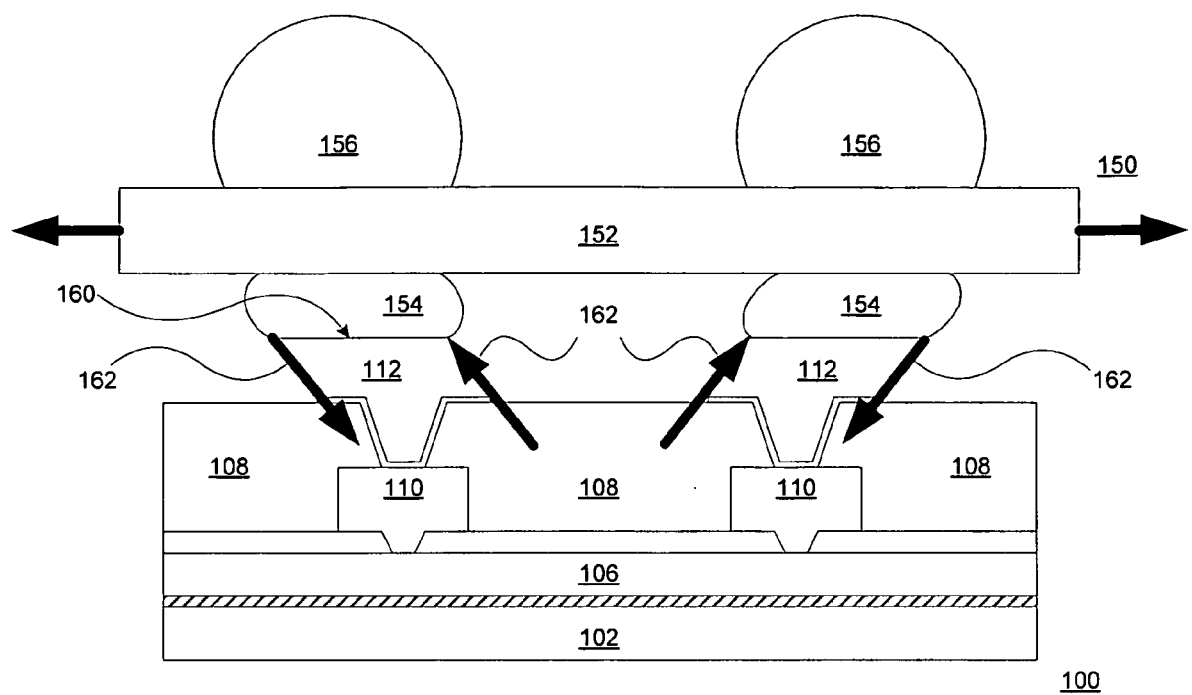
FIGS. 1B and 1C illustrate how the CTE mismatch between the IC die and the IC package imparts compressive and tensile stresses into the IC die.
Figure 1C:
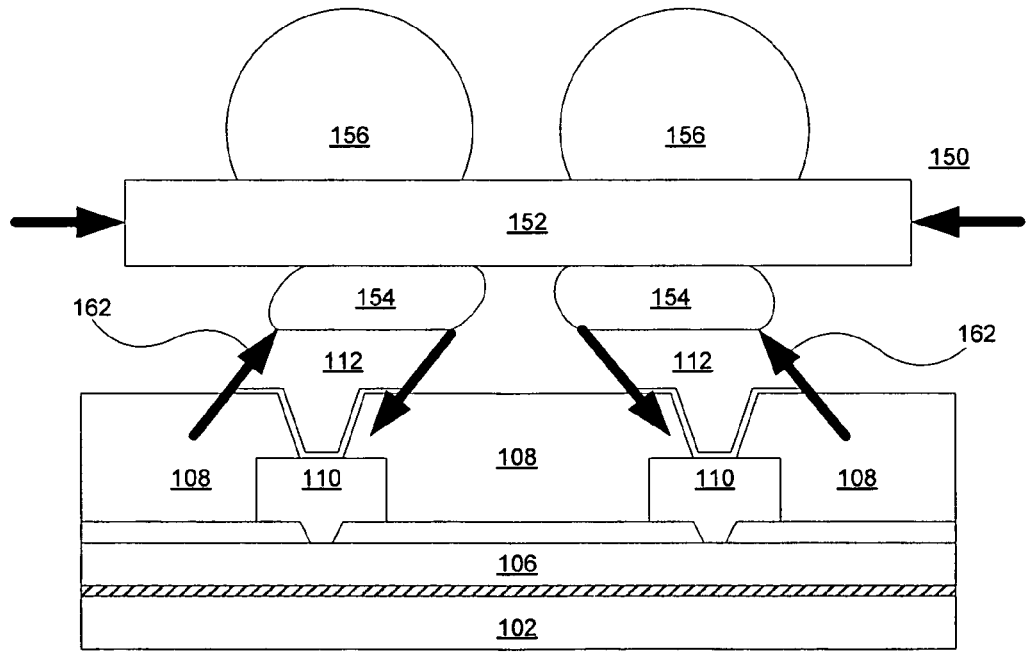

FIGS. 1B and 1C illustrate how the flip-chip connection can induce stress in the IC die 100. First, the IC die 100 is shown coupled to IC package 150. Methods for physically connecting the die and package are well known in the art. As shown, each solder ball 154 is electrically and physically connected to a metal bump 112 along an interface 160. During the reflow process to physically join the solder balls 154 and the metal bumps 112, the solder balls 154 wet the metal bumps 112 all the way to the edges of the metal bumps 112. Therefore the solder bumps 154 tend to be larger in diameter than the metal bumps 112.

As illustrated, the induced stress is due to the coefficient of thermal expansion (CTE) of the IC die 100 being much lower than that of the IC package 150. Since the IC die 100 and IC package 150 are constantly subjected to wide variances in temperature, such as during fabrication and also during actual use in product, the CTE difference causes the IC package 150 to expand and contract at a higher rate than the IC die 100. This places significant stress on the solder ball/metal bump connections, transmitting compressive and tensile stresses into the ILD layers within metallization layer 106 of IC die 100 and causing cracking and/or delamination issues.

For instance, FIG. 1B illustrates what happens at a relatively high temperature. In this case, the IC package 150 expands at a greater rate than the IC die 100, pulling the solder balls 154 away from the center of the IC package 150 and therefore pulling the metal bumps 112 away as well. Arrows 162 generally illustrate the compressive and tensile stresses that propagate directly into the IC die 100. Similarly, FIG. 1C illustrates what happens at a relatively low temperature. In this case, the IC package 150 contracts at a greater rate than the IC die 100, pushing the solder balls 154 into the center of the IC package 150 and therefore pushing the metal bumps 112 as well. Again, arrows 162 generally illustrate the compressive and tensile stresses that directly propagate into the IC die 100 in this situation.

Figure 1D:
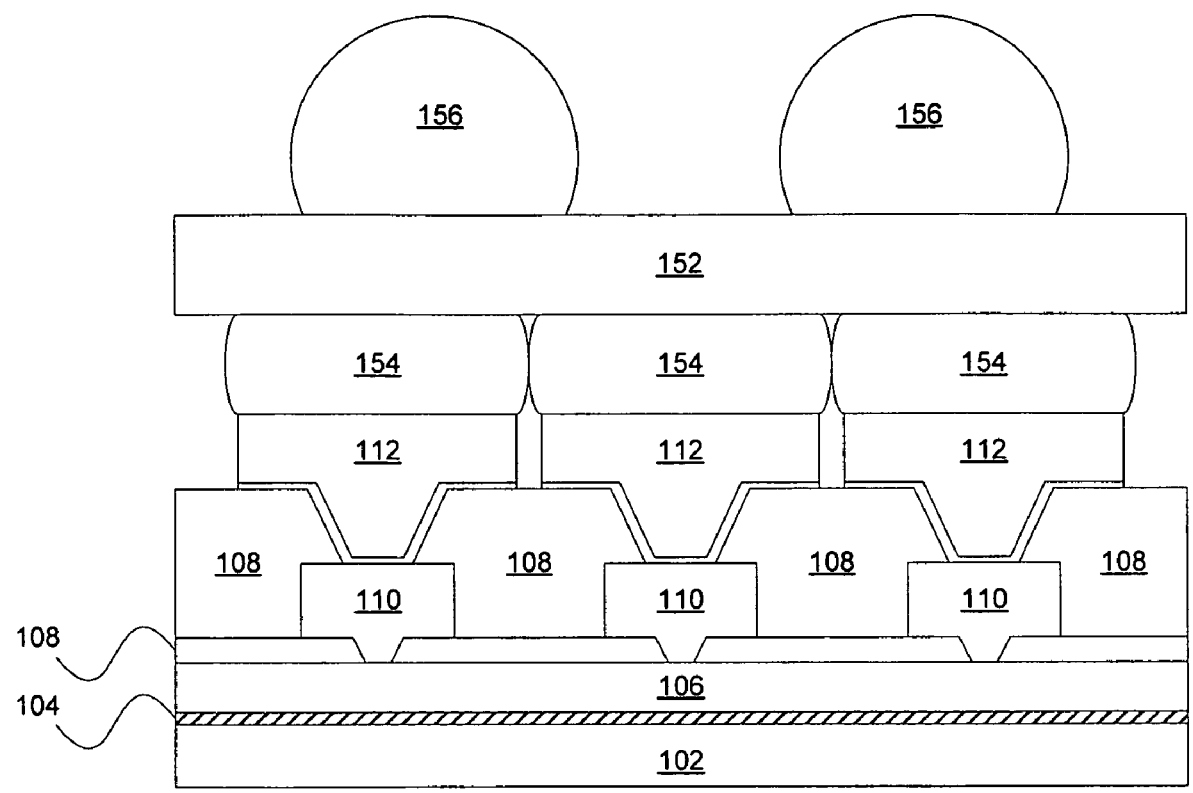
FIG. 1D illustrates problems associated with the use of wider metal bumps.

One approach to reducing cracking and delamination has been the use of wider metal bumps 112 that can spread stresses out over a larger area. Unfortunately, as IC dies 100 trend smaller in size but increase in terms of performance, the number of required input/output connections has increased, resulting in smaller pitches and reduced spacing between adjacent metal bumps 112. And as shown in FIG. 1D, as the space between metal bumps 112 is minimized, the associated solder balls 154 tend to come into contact with one another and short circuit. As such, narrow metal bumps 112 must be used, limiting their ability to spread out the stresses induced by the IC package 150.

Figure 2A:
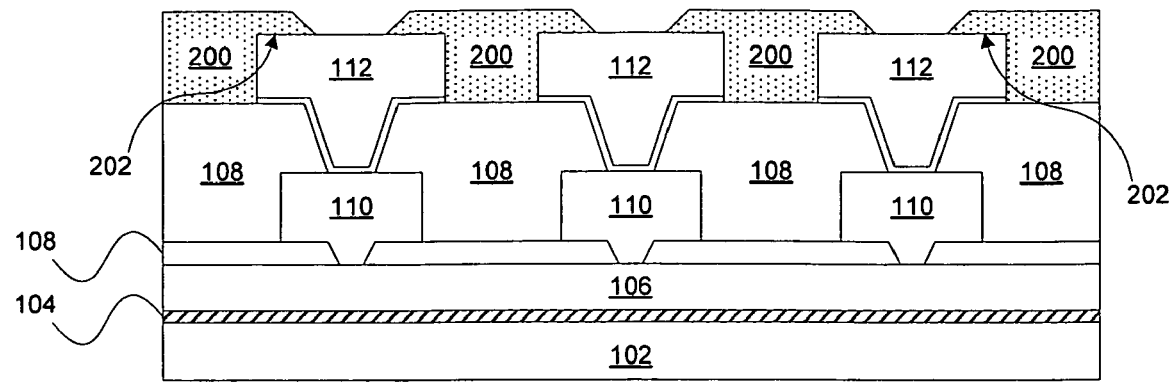
FIGS. 2A and 2B illustrate a solder limiting layer in accordance with an implementation of the invention.
Figure 2B:
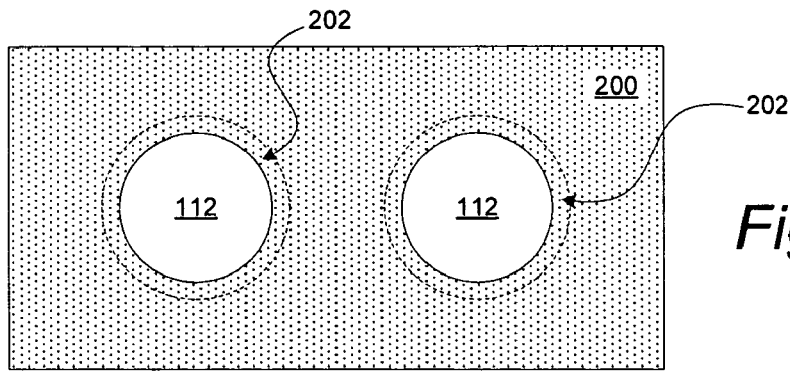

To overcome the deficiencies in the prior art, FIG. 2A illustrates a solder limiting layer 200 in accordance with an implementation of the invention. The solder limiting layer 200 is formed over the passivation layer 108 and over portions of the metal bumps 112. The solder limiting layer 200 masks a portion of the top surface of the metal bump 112, thereby limiting the amount of surface area that is available to the solder ball 154. More specifically, the solder limiting layer 200 masks an outer edge 202 of the top surface of each metal bump 112, thereby making these top surface outer edges 202 non-wettable to solder. This prevents the solder ball 154 from wetting all the way to the outer edges of the metal bump 112. FIG. 2B illustrates a top-down view of the solder limiting layer 200 masking the top surface outer edges 202 of the metal bump 112, thereby allowing only a center portion of the top surface to be exposed. In various implementations, the solder limiting layer 200 may mask anywhere from 15% to 95% of the top surface of the metal bumps 112. In some implementations, the solder limiting layer 200 may mask anywhere from 35% to 50% of the top surface of the metal bumps 112.

Figure 2C:
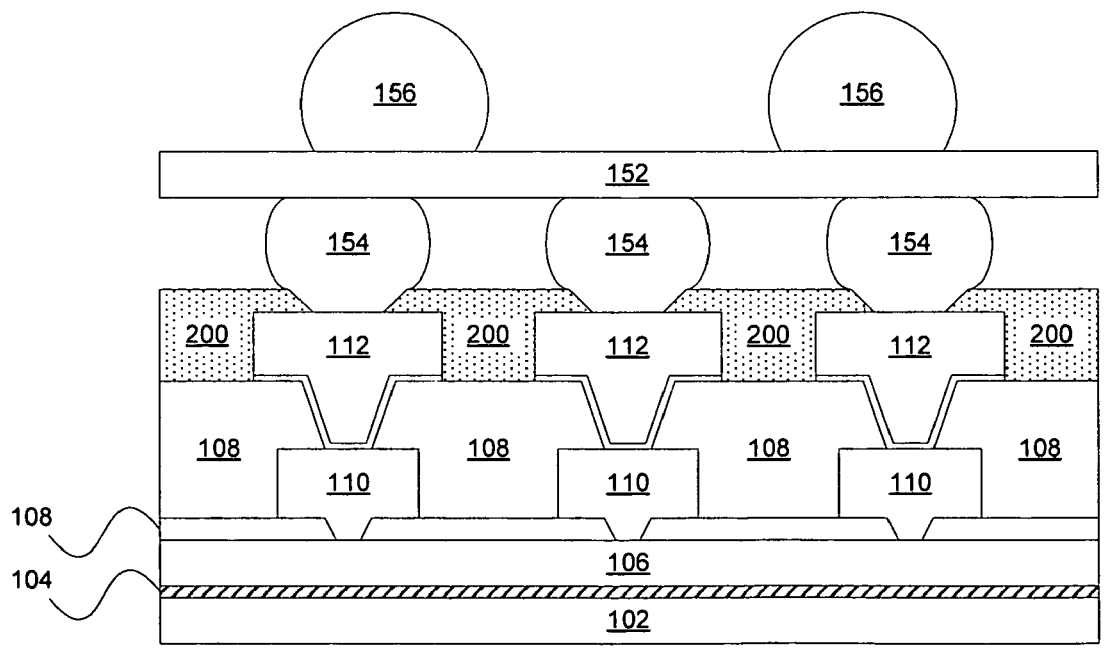
FIG. 2C illustrates a flip-chip connection formed using the solder limiting layer of the invention.

As shown in FIG. 2C, when the IC die 100 with the solder limiting layer 200 is coupled to the IC package 150, the solder balls 154 are restricted to a middle portion of the top surface of the metal bumps 112. The solder balls 154 cannot wet the outer edges of the metal bumps 112 and therefore do not extend past the outer edges of the metal bumps 112.

The solder limiting layer 200 may be formed using a variety of insulating materials that are compatible with a semiconductor fabrication process and that are non-wettable by a solder material. Some examples of materials that may be used for the solder limiting layer 200 include, but are not limited to, photodefinable polymeric dielectric materials, conventional dielectric materials, epoxies, silicones, polyimides, non-wettable metals such as aluminum and tungsten, and nitrides. Some specific examples of photodefinable polymeric dielectric materials include, but are not limited to, InterVia™ 8000-series photodefinable dielectric materials from Rohm and Haas, Cyclotene™ 4000-series photodefinable dielectric materials from Dow Chemical, SU-8 photodefinable epoxy materials from Microchem, WL-5000 series photodefinable silicone dielectric materials from Dow Corning, Avatrel® photodefinable dielectric materials from Promerus, SINR-series photodefinable dielectric materials from ShinEtsuMicroSi, SUMIRESIN EXCEL® CRC-8600 series photodefinable dielectric materials from Sumitomo Bakelite Co., Ltd., AP2210, AN-3310, and Durimide 7000-series photodefinable polyimide materials from FujiFilm, Photoneece™ photodefinable polyimide materials from Toray, Pimel™ photodefinable polyimide materials from Asahi Kasei EMD, photodefinable polyimide materials from HD Microsystems, TMMR S2000 photodefinable dielectric material from Tokyo Ohka Kogyo Co. Ltd., and WPR-series photodefinable dielectric materials from JSR Micro, Inc.

Figure 2D:
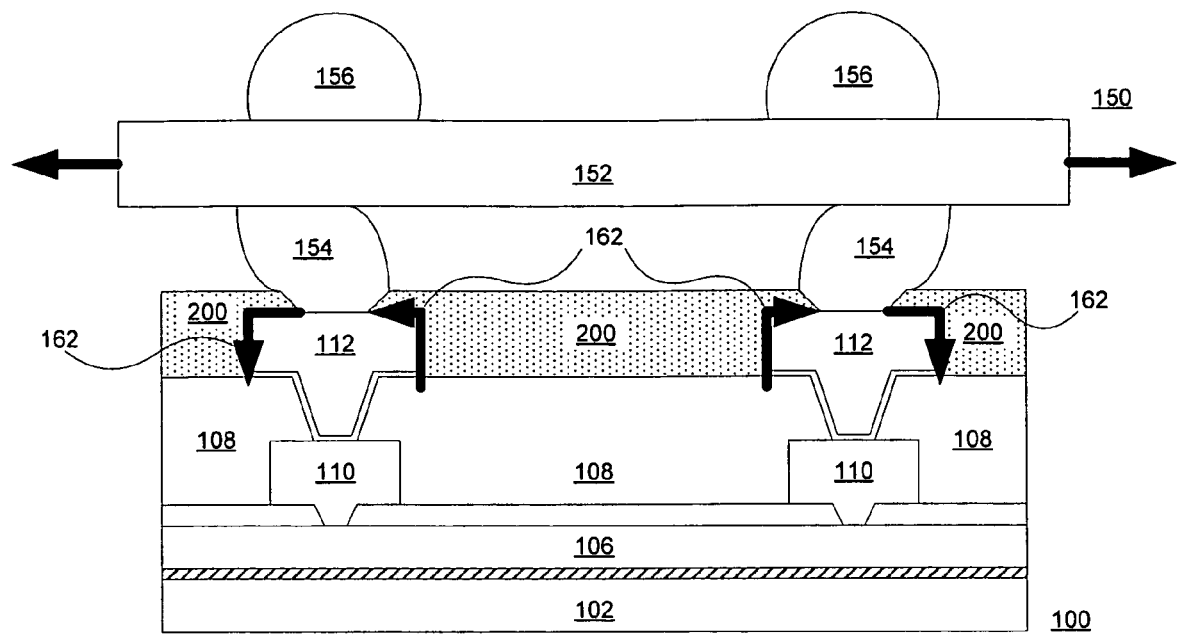
FIGS. 2D and 2E illustrate how a flip-chip connection formed using the solder limiting layer of the invention can alleviate stresses in the IC die.
Figure 2E:
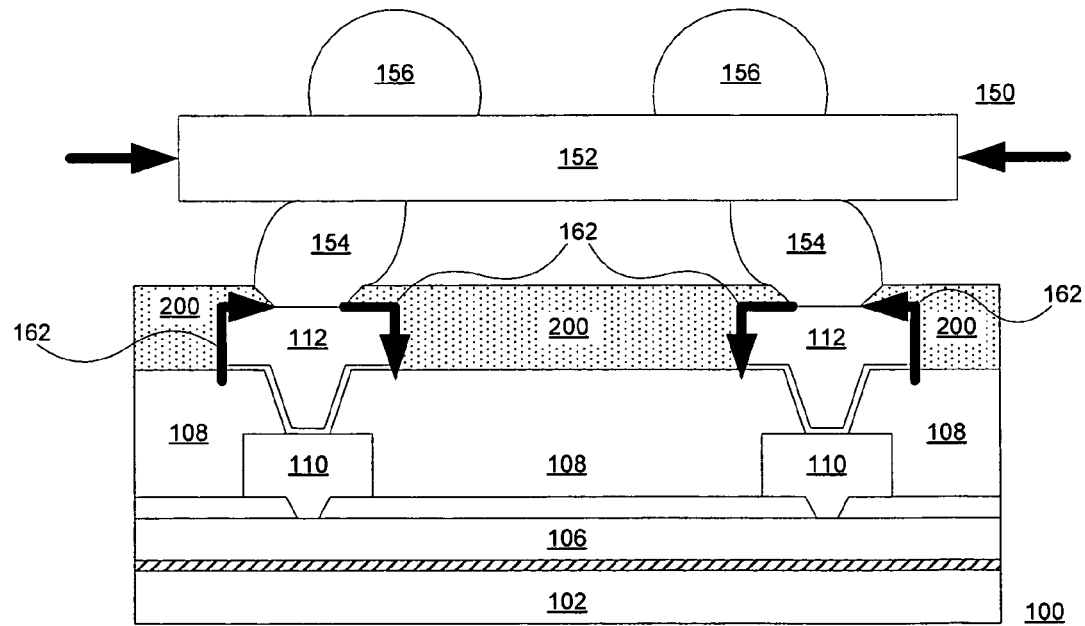

FIGS. 2D and 2E illustrate how a flip-chip connection formed using an implementation of the solder limiting layer of the invention can alleviate stresses in the IC die 100. FIG. 2D illustrates what happens at a relatively high temperature when the IC package 150 expands at a greater rate than the IC die 100. FIG. 2E illustrates what happens at a relatively low temperature when the IC package 150 contracts at a greater rate than the IC die 100. Arrows 162 generally illustrate the compressive and tensile stresses that are generated.

Unlike the stresses shown in FIGS. 1B and 1C, in accordance with implementations of the invention, the stresses are partially mitigated here due to their initial propagation in a direction that is parallel to the top surface of the IC die 100. The stresses travel across a portion of the top surface of the metal bumps 112 into the solder limiting layer 200 before being propagated into the IC die 100. This reduces the compressive and tensile stresses transferred into the die 100 and at least partially mitigates issues such as cracking and/or delamination of the dielectric layers. In some instances the cracking and/or delamination may be completely mitigated.

Figure 2F:
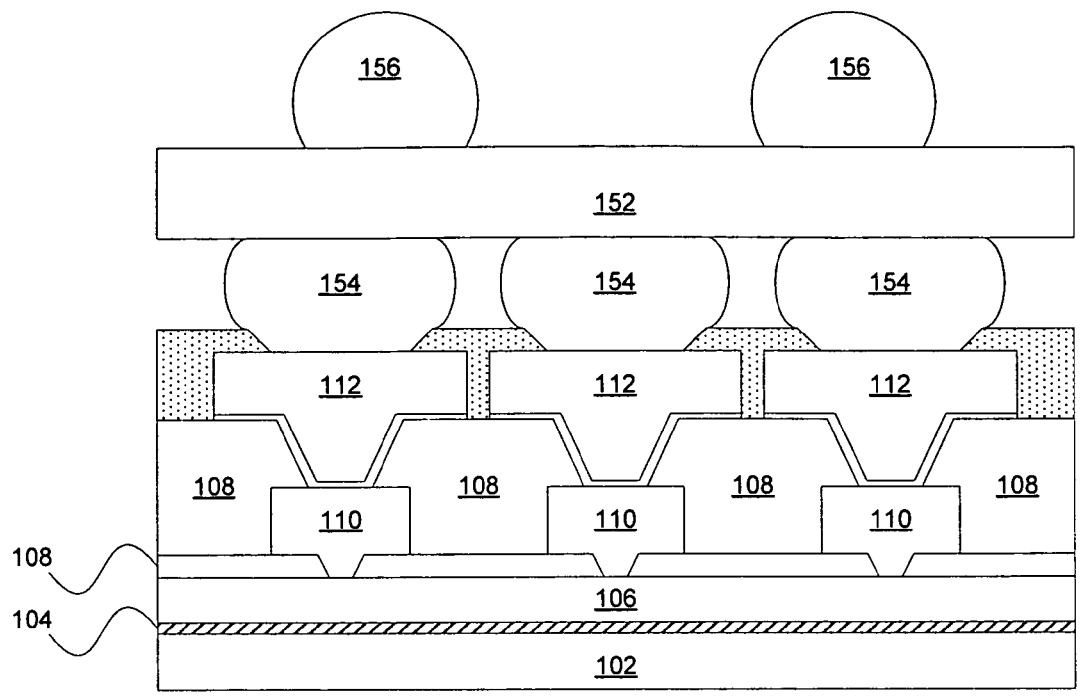
FIG. 2F illustrates an implementation in which wider metal bumps are used in conjunction with the solder limiting layer of the invention.

FIG. 2F illustrates another implementation of the invention in which wider metal bumps 112 are used in conjunction with the solder limiting layer 200. Again, the wider metal bumps 112 can spread stresses out over a larger area. Here, when the space between metal bumps 112 is minimized, the solder limiting layer 200 prevents the solder balls 154 from contacting one another, thereby preventing the short circuits that can occur in the prior art as shown in FIG. 1D.

Figure 3:
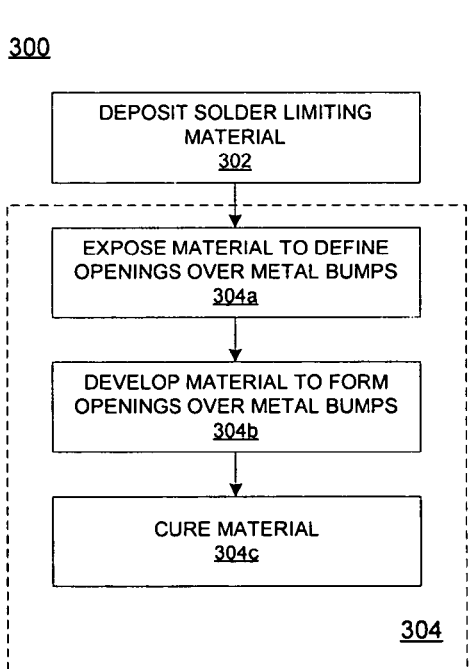
FIG. 3 is a method of forming a solder limiting layer in accordance with an implementation of the invention.

FIG. 3 is a method 300 of forming a solder limiting layer 200 in accordance with an implementation of the invention. Given an IC die 100 that includes a plurality of metal bumps 112, the method 300 begins by depositing a blanket layer of solder limiting material over the IC die 100 and the metal bumps 112 (process 302 of FIG. 3). The solder limiting material may cover the metal bumps 112 in their entirety. In this implementation, the solder limiting material may be any of the photodefinable polymeric dielectric materials described above. The photodefinable polymeric dielectric material may be deposited using convention deposition methods, including but not limited to physical vapor deposition, sputtering, spin-on deposition, atomic layer deposition, or chemical vapor deposition. Alternate deposition processes available for use with photodefinable polymeric dielectric materials may be used as well.

Next, the solder limiting material is patterned to form openings that expose a portion of the top surface of each metal bump 112 (process 304). The solder limiting material is patterned using known photolithography processes that are appropriate for photodefinable polymeric dielectric material. In accordance with implementations of the invention, the patterning process removes the solder limiting material from a portion of the top surface of each metal bump 112 without substantially exposing the outer edges of the metal bumps 112.

Patterning processes, namely photolithography processes, are well known in the art. The photolithography process will generally include an exposure step to define openings over the metal bumps 112 in the solder limiting material (process 304a). Note that the openings are simply defined in this step; the openings are not yet formed. In accordance with the invention, the defined openings do not extend to the edges of the metal bumps 112. Rather, they substantially cover a center portion of the top surface of each bump 112. The exposure step uses an optical mask and some form of radiation, such as ultraviolet radiation or extreme ultraviolet radiation.

Next, in a development step, a developer solution is applied to remove those portions of the photodefinable dielectric material that define the openings over the metal bumps 112 (process 304b). Those portions removed will be either the exposed or unexposed regions, depending on whether the photodefinable polymeric dielectric material is positive-tone or negative-tone. When those portions are removed, the end result is a solder limiting layer 200 that masks the edges of the metal bumps 112 but leaves a portion of the top surfaces of the metal bumps 112 exposed. In some implementations, the final solder limiting layer 200 may be baked or cured to harden the layer (process 304c).

Figure 4:
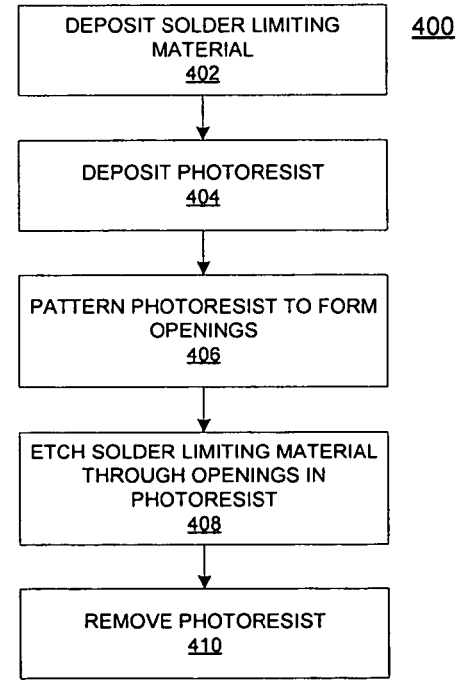
FIG. 4 is a method of forming a solder limiting layer in accordance with another implementation of the invention.

In another implementation of the invention, a material other than a photodefinable polymeric dielectric material may be used for the solder limiting material. For instance, certain other dielectric materials, epoxies, silicones, polyimides, and nitrides may be used if they are non-wettable to solder and they have the appropriate compatibility and insulating properties. FIG. 4 describes this alternate method 400.

FIG. 4 is a method 400 of using a photoresist to pattern openings in a solder limiting material. When the solder limiting material is not photodefinable, a conventional patterning process may be used to form the openings over the metal bumps 112. For instance, given an IC die 100 that includes a plurality of metal bumps 112, the method 400 begins by depositing a blanket layer of solder limiting material over the IC die 100 and the metal bumps 112 (process 402 of FIG. 4). The solder limiting material may cover the metal bumps 112 in their entirety.

Next, a layer of photoresist material is deposited on the solder limiting material (process 404). The photoresist material is patterned using known photolithography processes to form openings in the photoresist that are aligned over each metal bump 112 but do not substantially extend to the edges of each metal bump 112 (process 406). The patterning process for the photoresist includes known exposure, baking, and development steps.

These openings in the photoresist are then used as a mask to etch the underlying solder limiting material and transfer the openings from the photoresist layer into the solder limiting material (process 408). The openings in the solder limiting material expose a portion of the top surface of each metal bump 112 without substantially exposing the edges of the metal bumps 112. The etching process is carried out using an etchant that is appropriate for the chosen solder limiting material.

Finally, the photoresist material is removed (process 410) and the end result is a solder limiting layer 200 that masks the outer edges of the metal bumps 112 but leaves a portion of the top surfaces of the metal bumps 112 exposed. In some implementations, the final solder limiting layer 200 that is formed may be baked to further harden the layer.

Figure 5A:
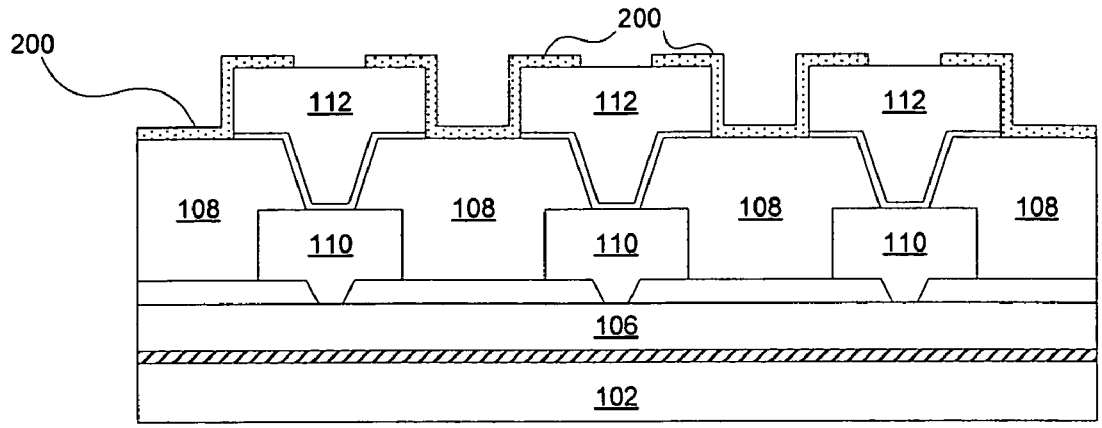
FIGS. 5A to 5C illustrate alternate implementations of the solder limiting layer of the invention.
Figure 5B:
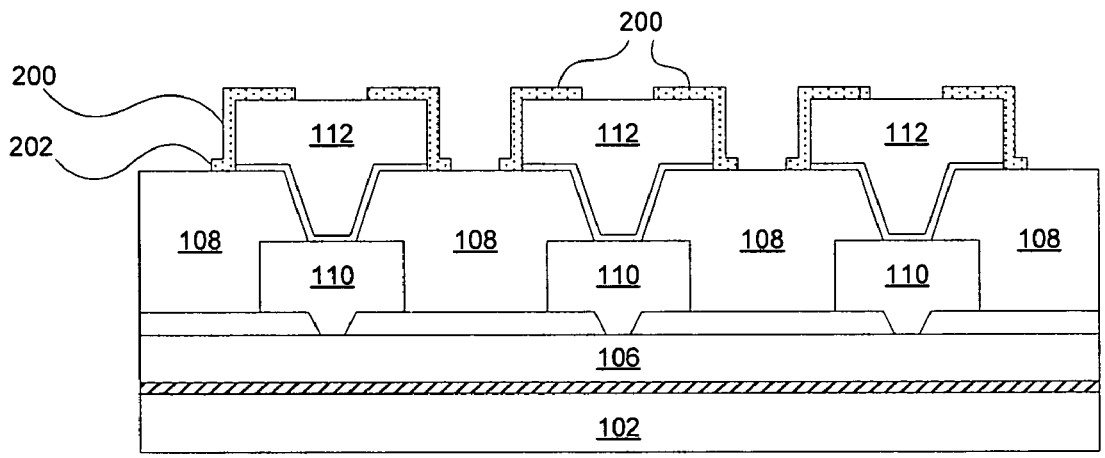
Figure 5C:
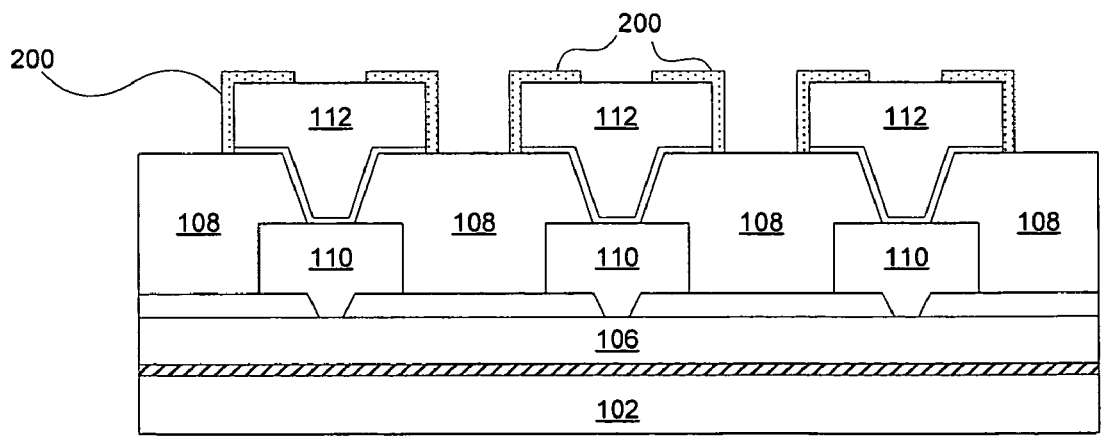

FIG. 5A illustrates a solder limiting layer in accordance with another implementation of the invention. Here, the solder limiting layer 200 is a relatively thin conformal layer. Processes known in the art for depositing conformal layers, such as CVD and ALD, may be used. The spaces between metal bumps 112 may be filled with an underfill material that differs from the solder limiting layer 200, such as an epoxy. FIGS. 5B and 5C illustrate other variations of a conformal solder limiting layer 200. Here, portions of the layer 200 on the field between metal bumps 112 are removed. In FIG. 5A, a lip portion 202 of the solder limiting layer 200 remains at the base of each metal bump 112. In FIG. 5B, even this lip portion has been removed. The solder limiting layer 200 is therefore a discontinuous layer in the implementations of FIGS. 5B and 5C.

Figure 6A:
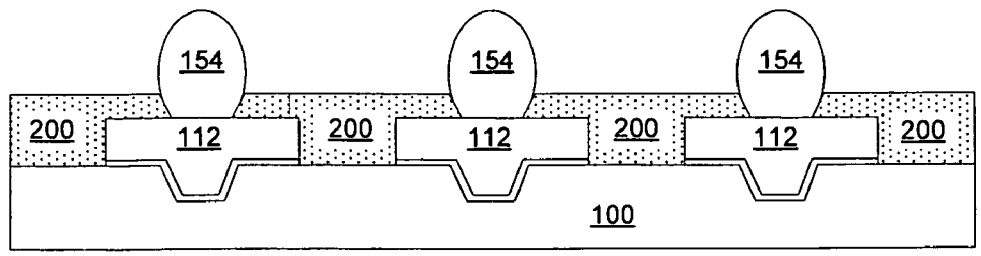
FIGS. 6A to 6D illustrate further implementations of the invention that include preattached solder balls.
Figure 6B:
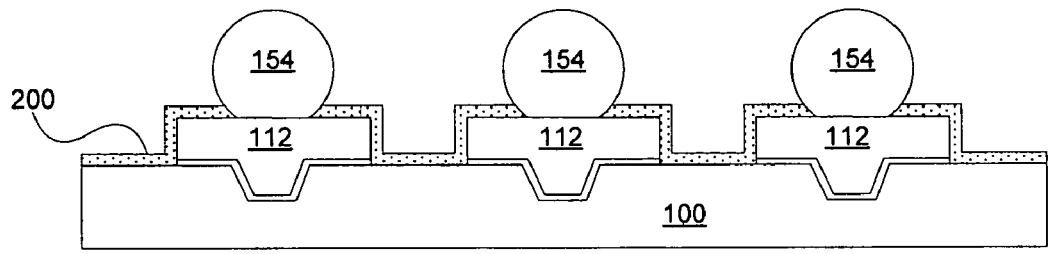
Figure 6C:
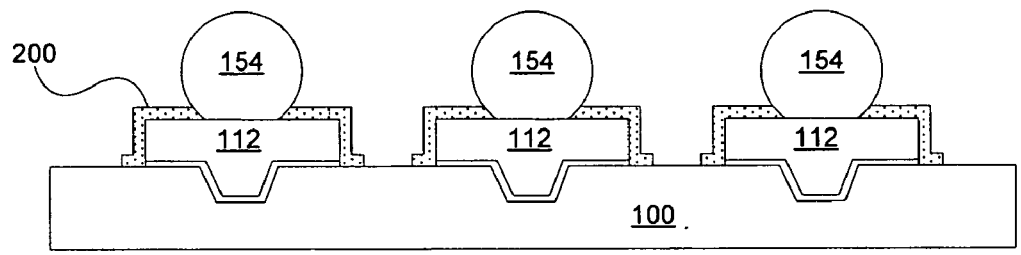
Figure 6D:
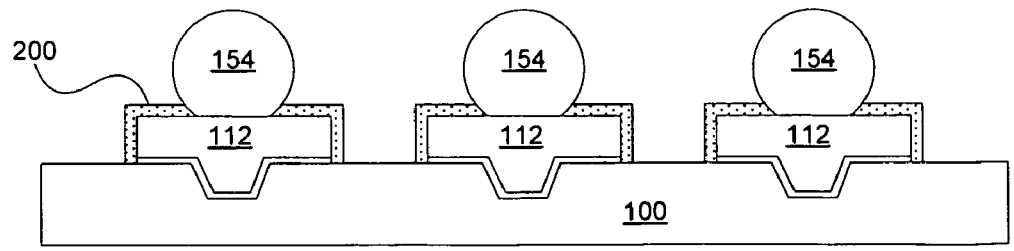

FIGS. 6A to 6D illustrate further alternate implementations of the solder limiting layer 200. In these implementations, a solder ball 154 is preattached to the IC die 100 instead of being a part of an IC package 150. FIG. 6A illustrates a preattached solder ball 154 being used with a solder limiting layer 200 of the invention. FIG. 6B illustrates a preattached solder ball 154 being used with a conformal solder limiting layer 200 of the invention. FIG. 6C illustrates a preattached solder ball 154 being used with a discontinuous conformal solder limiting layer 200 of the invention, where the solder limiting layer includes lip portions 202. And FIG. 6D illustrates a preattached solder ball 154 being used with a discontinuous conformal solder limiting layer 200 of the invention having no lip portions.

Figure 7A:
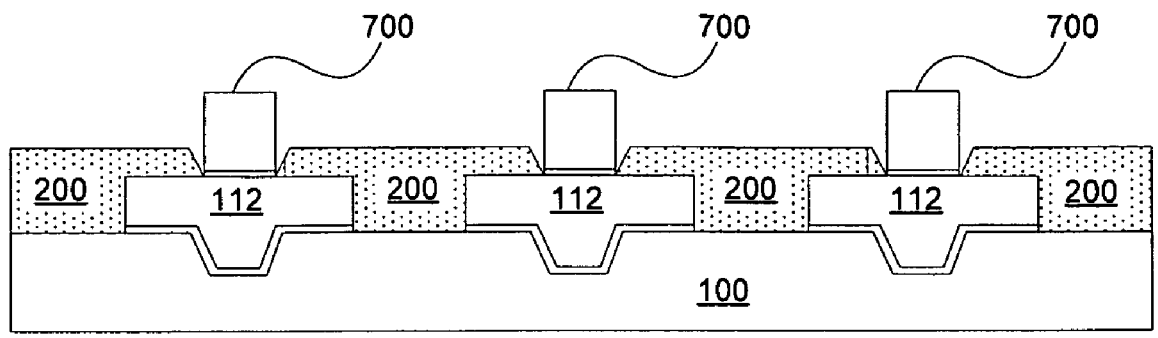
FIGS. 7A and 7B illustrate further implementations of the invention that include additional metal bumps.
Figure 7B:
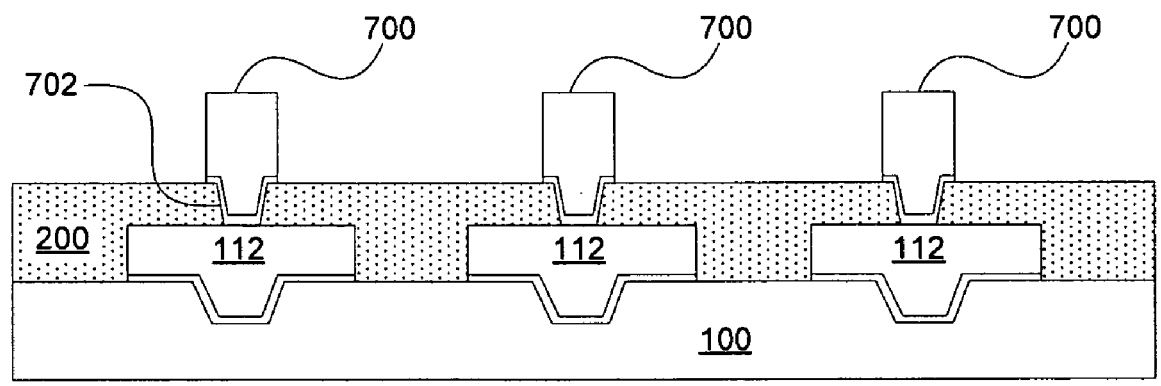

FIGS. 7A and 7B illustrate further implementations in which additional metal bumps 700 are used to move stresses further away from the IC die 100. In FIG. 7A, the additional metal bumps 700 are formed in the openings in the solder limiting layer 200. And in FIG. 7B, the additional metal bumps 700 are formed atop the solder limiting layer 200. The openings in the solder limiting layer 200 are replaced in this implementation by vias 702 that couple the metal bumps 112 to the additional metal bumps 700.

Therefore, a solder limiting layer has been described that restricts how much of the surface of a metal bump 112 may be wettable by a solder ball 154. In accordance with implementations of the invention, the solder limiting layer prevents the edges of the metal bumps from being wettable by the solder balls, thereby confining the solder ball to a portion of the top surface of the metal bump. The solder limiting layer also helps to distribute the stress when the IC package is attached to the IC die. The implementations of the invention disclosed here provide additional low-k ILD protection that enable reduced bump pitches and allow for the use of relatively weaker low-k ILD materials and weaker metal layer structures, including air-gap structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
   an integrated circuit die having a metal bump formed on its top surface; and
   a solder limiting layer formed on the integrated circuit die, wherein the solder limiting layer masks a portion of a top surface of the metal bump, thereby preventing solder from wetting the masked portion of the metal bump.

2. The apparatus of claim 1, wherein the solder limiting layer comprises a photodefinable polymeric dielectric material.

3. The apparatus of claim 1, wherein the solder limiting layer comprises a material selected from the group consisting of dielectric materials, epoxies, silicones, polyimides, non-wettable metals, and nitrides.

4. The apparatus of claim 1, wherein the solder limiting layer fills in the spaces between the metal bumps and electrically insulates the metal bumps from one another.

5. The apparatus of claim 1, wherein the masked portion comprises an outer edge of the top surface of the metal bump.

6. The apparatus of claim 1, wherein the metal bump includes a metal chosen from the group consisting of copper, nickel, palladium, cobalt, iron, silver, gold, and platinum.

7. The apparatus of claim 1, wherein the solder limiting layer masks between 30% and 50% of the top surface of the metal bump.

8. An apparatus comprising:
   a semiconductor substrate having a device layer, a plurality of metallization layers, a passivation layer, and a metal bump formed on the passivation layer that is electrically coupled to at least one of the metallization layers; and
   a solder limiting layer formed on the passivation layer that masks an outer edge of the top surface of the metal bump, thereby making the outer edge of the top surface non-wettable to a solder material.

9. The apparatus of claim 8, wherein the solder limiting layer comprises a photodefinable polymeric dielectric material.

10. The apparatus of claim 8, wherein the solder limiting layer comprises a material selected from the group consisting of dielectric materials, epoxies, silicones, polyimides, non-wettable metals, and nitrides.

11. The apparatus of claim 8, wherein the solder limiting layer masks between 30% and 50% of the top surface of the metal bump.

12. An apparatus comprising:
    an integrated circuit die having a metal bump formed on its top surface;
    a solder limiting layer formed on the integrated circuit die, wherein the solder limiting layer substantially masks an outer edge of a top surface of the metal bump to make the outer edge non-wettable to solder; and
    a solder ball mounted on the metal bump, wherein the solder ball does not wet the outer edge of the top surface of the metal bump due to the solder limiting layer.

13. The apparatus of claim 12, wherein the solder limiting layer comprises a photodefinable polymeric dielectric material.

14. The apparatus of claim 12, wherein the solder limiting layer comprises a material selected from the group consisting of dielectric materials, epoxies, silicones, polyimides, non-wettable metals, and nitrides.

15. The apparatus of claim 12, wherein the solder limiting layer masks between 30% and 50% of the top surface of the metal bump.

16. The apparatus of claim 12, wherein the metal bump includes a metal chosen from the group consisting of copper, nickel, palladium, cobalt, iron, silver, gold, and platinum.

17. An apparatus comprising:
    an integrated circuit die having a first metal bump formed on its top surface;
    a solder limiting layer formed on the integrated circuit die, wherein the solder limiting layer substantially masks an outer edge of a top surface of the metal bump to make the outer edge non-wettable to solder; and
    a second metal bump mounted on the first metal bump, wherein the second metal bump ball does not contact the outer edge of the top surface of the first metal bump due to the solder limiting layer.

18. The apparatus of claim 17, wherein the solder limiting layer comprises a photodefinable polymeric dielectric material.

19. The apparatus of claim 17, wherein the solder limiting layer comprises a material selected from the group consisting of dielectric materials, epoxies, silicones, polyimides, non-wettable metals, and nitrides.

20. The apparatus of claim 17, wherein the solder limiting layer masks between 30% and 50% of the top surface of the metal bump.

21. The apparatus of claim 17, wherein the first metal bump includes a metal chosen from the group consisting of copper, nickel, palladium, cobalt, iron, silver, gold, and platinum.

22. The apparatus of claim 17, wherein the second metal bump includes a metal chosen from the group consisting of copper, nickel, palladium, cobalt, iron, silver, gold, and platinum.

* * * * *